United States Patent [19]
Renken et al.

[11] Patent Number: 4,891,616
[45] Date of Patent: Jan. 2, 1990

[54] PARALLEL PLANAR SIGNAL TRANSMISSION SYSTEM

[75] Inventors: Gerald W. Renken, Edina; Kimberly J. Gray, Lakeville; Michael W. Greenwood, Maplegrove, all of Minn.

[73] Assignee: Honeywell Inc., Minneapolis, Minn.

[21] Appl. No.: 201,001

[22] Filed: Jun. 1, 1988

[51] Int. Cl.⁴ .............................................. H01P 3/02
[52] U.S. Cl. .................................. 333/236; 174/68.5; 174/117 FF; 174/268
[58] Field of Search ............... 333/236, 238, 246, 161, 333/1; 174/117 PC, 117 F, 117 FF, 68.5, 36 R; 361/409, 412

[56] References Cited

U.S. PATENT DOCUMENTS

| 3,459,879 | 8/1969 | Gerpheide | 333/1 |
| 3,757,028 | 9/1973 | Schlessel | 174/68.5 X |
| 3,859,711 | 1/1975 | McKiddy | 174/68.5 X |
| 3,875,542 | 4/1975 | Holland et al. | 333/246 X |
| 3,876,822 | 4/1975 | Davy et al. | 361/409 X |
| 4,045,750 | 8/1977 | Marshall | 333/236 X |
| 4,047,132 | 9/1977 | Krajewski | 333/238 |
| 4,143,931 | 3/1979 | Skare et al. | 174/117 FF X |
| 4,255,613 | 3/1981 | Ketchpel | 174/117 FF X |
| 4,362,899 | 12/1982 | Borrill | 174/117 PC X |
| 4,498,122 | 2/1985 | Rainal | 174/36 X |
| 4,560,962 | 12/1985 | Barrow | 333/1 |
| 4,616,292 | 10/1986 | Sengoku et al. | 361/409 X |
| 4,692,720 | 9/1987 | Auracher | 333/246 X |
| 4,733,209 | 3/1988 | Paynting | 333/246 X |
| 4,743,868 | 5/1988 | Katoh et al. | 333/204 X |
| 4,785,135 | 11/1988 | Ecker et al. | 333/238 X |

FOREIGN PATENT DOCUMENTS

| 0021665 | 2/1980 | Japan | 333/238 |
| 0154804 | 11/1981 | Japan | 333/161 |

OTHER PUBLICATIONS

Rabbat, "Reducing Crosstalk in Microstrip Lines", IBM Tech. Disclosure Bulletin, vol. 18, No. 5, Oct. 1975, pp. 1430–1435.

Primary Examiner—Eugene R. LaRoche
Assistant Examiner—Seung Ham
Attorney, Agent, or Firm—Haugen and Nikolai

[57] ABSTRACT

A differential-mode signal transmission system includes a circuitboard composed of at least one dielectric board substrate and a pair of spaced apart conductive parallel planar signal transmission lines disposed on one surface of the substrate and extending between a pair of edges thereof for providing pass-through transmission of differential-mode signals from one to the opposite edge of the substrate. Preferably, the circuitboard is composed of at least a pair of dielectric board substrates being disposed in face-to-face layered contact with one another and having at least one pair of the spaced apart conductive parallel planar signal transmission lines disposed between the layered substrates along the inner surfaces thereof. Ground planes are provided on the outer surfaces of the layered substrates for electrically shielding the parallel planar transmission line pair. Connectors in the form of spaced pairs of conductively plated through holes being electrically isolated from the ground planes on substrate outer surfaces are provided through the substrates and electrically connected to the parallel planar transmission lines for facilitating connection of electrical components thereto.

9 Claims, 2 Drawing Sheets

PARALLEL PLANAR SIGNAL TRANSMISSION SYSTEM

BACKGROUND OF THE INVENTION

1. Field of the Invention

The present invention generally relates to electrical signal transmission systems and, more particularly, is concerned with a signal transmission system incorporating parallel planar transmission lines for differential-mode signal transmission.

2. Description of the Prior Art

Shielded twisted pair transmission lines are often used to carry electrical signals such as digital pulses with fast rise/fall times and high-speed clock frequencies between a digital system under test and the test equipment evaluating the performance of that system. Overall, the shielded twisted pair transmission lines provide a low loss signal transmission system that delivers the signals with good fidelity, contributing minimal effects to the signal shape.

In particular, heretofore, shielded twisted pair transmission lines have been the preferred transmission system for differential-mode signal transmission applications. The differential signal mode is used to minimize signal losses, and interference from noise signals on transmission lines. These are necessary properties for any transmission line carrying low level signal amplitudes. Single-ended transmission line modes used on coaxial, stripline and microstrip transmission lines can pick up considerable levels of noise signals and common mode currents. The differential signal transmission mode minimizes these signal interference problems.

Although shielded pair transmission lines have been the preferred transmission system for their capability of transmitting in the differential signal mode, they create problems in connecting their low amplitude signals to circuitboards. Particularly, the problems arise when they must interface with different types of transmission line systems such as coaxial cable and stripline. If the differential-mode, shielded twisted pair transmission lines are connected to controlled impedance, single end lines such as coaxial cable, stripline or microstrip, then the above-described advantages of signal transmission in the differential mode are lost. While a controlled characteristic impedance is maintained on these three types of single ended lines, the initial differential-mode signal will suffer increased signal losses and will pick up noise signal interference.

If differential-mode, shielded twisted pair transmission lines are connected to parallel printed circuitboard traces, the differential-mode will be preserved, but now a characteristic impedance mismatch will occur. Signal losses from reflections and losses in signal fidelity will result.

Therefore, a need exists for an alternative signal transmission system to avoid the aforementioned problems in interfacing shield twisted pair transmission lines with circuitboards.

SUMMARY OF THE INVENTION

The present invention provides differential-mode parallel planar signal transmission system designed to satisfy the aforementioned needs.

The major advantages to be gained from using the parallel planar signal transmission system of the present invention are as follows: (1) balanced transmission line structure is provided for transmitting signals in differential mode; (2) higher values for characteristic impedance can be achieved more easily; (3) production cost is low compared to coaxial cable or shielded twisted pair transmission lines; (4) final product embodying the invention is more consistent, more repeatable and more reliable from using standard printed wiring board technology processes in its fabrication; (5) need and cost for discrete feedlines and associated cost to put connectors on each of the discrete lines are eliminated; (6) increased ELECTRONIC OR RF part density ON THE CIRCUIT BOARD can be achieved because the interconnecting, controlled impedance lines are within DIFFERENT LAYERS OF the circuitboard, AND PASS directly under the ELECTRONIC OR RF PARTS ; (7) USING LOW DIELECTRIC CONSTANT SUBSTRATE MATERIALS, A reduction in THE THICKNESS of multilayer circuitboard layers can be realized while producible line widths CAN still maintained; (8) increased cross talk immunity from adjacent balanced transmission lines on same layer of the circuitboard is provided; and (9) improved signal error rate is realized from crosstalk reduction.

Accordingly, the present invention is directed to a signal transmission system for differential-mode signal transmission which comprises: (a) a circuitboard composed of at least one dielectric board substrate having opposite surfaces and being bounded by a plurality of opposite edges; and (b) a pair of spaced apart conductive parallel planar signal transmission lines disposed on one of the substrate surfaces and extending between a pair of the substrate edges for providing pass-through transmission of differential-mode signals from one to the other of the pair of substrate edges.

Further, connector means are disposed on the substrate and electrically connected to the pair of parallel planar transmission lines for facilitating connection of electrical components thereto. In one form, the connector means includes at least a pair of conductive elements defined on the substrate.

More particularly, in one embodiment, the circuitboard is composed of at least a pair of dielectric board substrates being disposed in face-to-face layered contact with one another at inner ones of their opposite surfaces. The pair of spaced apart parallel planar signal transmission lines are disposed between the substrates along the inner surfaces thereof and extend between corresponding pairs of the opposite edges thereof for providing the pass-through signal transmission from one to the other of the pair of edges of the substrate. Preferably, the connector means includes spaced pairs of conductively plated through holes defined in the substrate with the pair of parallel planar transmission lines being interrupted between the pairs of through holes.

Also, on the one hand, the pair of parallel planar transmission lines can be disposed in an electrically unshielded manner on an outer circuitboard surface. On the other hand, means can be disposed on outer ones of the surfaces of the circuitboard substrates for defining ground plates thereon which electrically shield the pair of parallel planar transmission lines being disposed between the substrates. In the latter case, connector means disposed in the substrates are exposed at least at one of the outer surfaces of the substrates, but electrically isolated from the ground plane defining means on the one substrate outer surface.

Furthermore, more than one pair of parallel planar transmission lines can be disposed between the substrates of the circuitboard. Also, the circuitboard can be composed of more than two layered substrates.

These and other advantages and attainments of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

In the course of the following detailed description, reference will be made to the attached drawings in which.

DETAILED DESCRIPTION OF THE INVENTION

Figure 1:
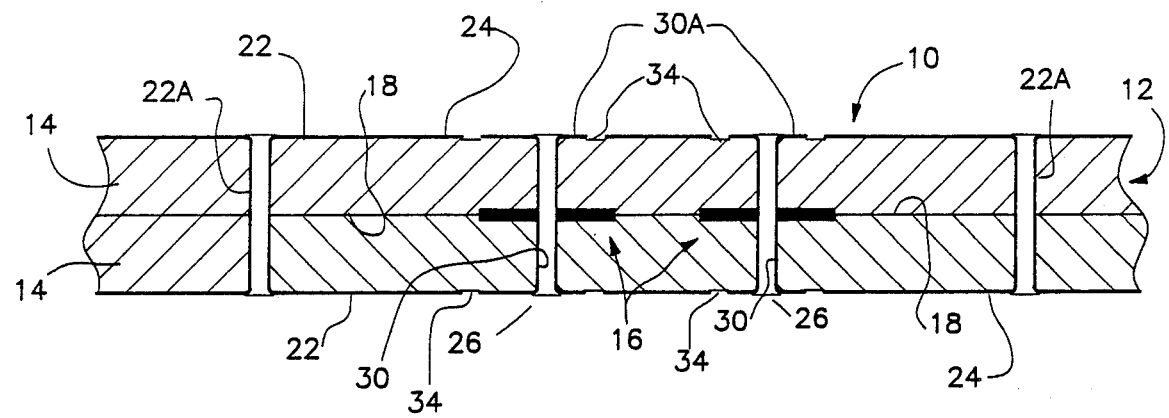
FIG. 1 is an enlarged fragmentary cross-sectional view of one embodiment of the differential-mode signal transmission system of the present invention.

Referring now to the drawings, and particularly to FIG. 1, there is shown, in cross-sectional form, a signal transmission system, generally designated 10, for differential-mode signal transmission in accordance with the principles of the present invention. In its basic components, the signal transmission system 10 includes a circuitboard 12 composed of one or more dielectric board substrates 14 and a pair of spaced apart conductive parallel planar signal transmission lines 16.

More particularly, as shown in FIG. 1, the circuitboard 12 of the transmission system 10 is composed of a pair of dielectric board substrates 14 disposed in layers with inner ones 18 of their opposite surfaces bonded or otherwise affixed together in face-to-face contact with one another. The spaced apart parallel planar signal transmission lines 16 are disposed between and affixed to the substrates 14 along their inner surfaces 16 and extend between corresponding pairs of opposite edges 20 (see FIG. 2) of the circuitboard substrates 14 for providing pass-through transmission of differential-mode signals from one to the other opposite edge 20 of the circuitboard 12.

Further, the signal transmission system 10 includes conductive ground planes 22 disposed on the outer ones 22 of the circuitboard surfaces for defining means thereon which electrically shield the pair of parallel planar transmission lines 16. Plated through holes 22A are provided through the circuitboard 12 to tie the ground planes 22 together to complete the shield.

Figure 2:
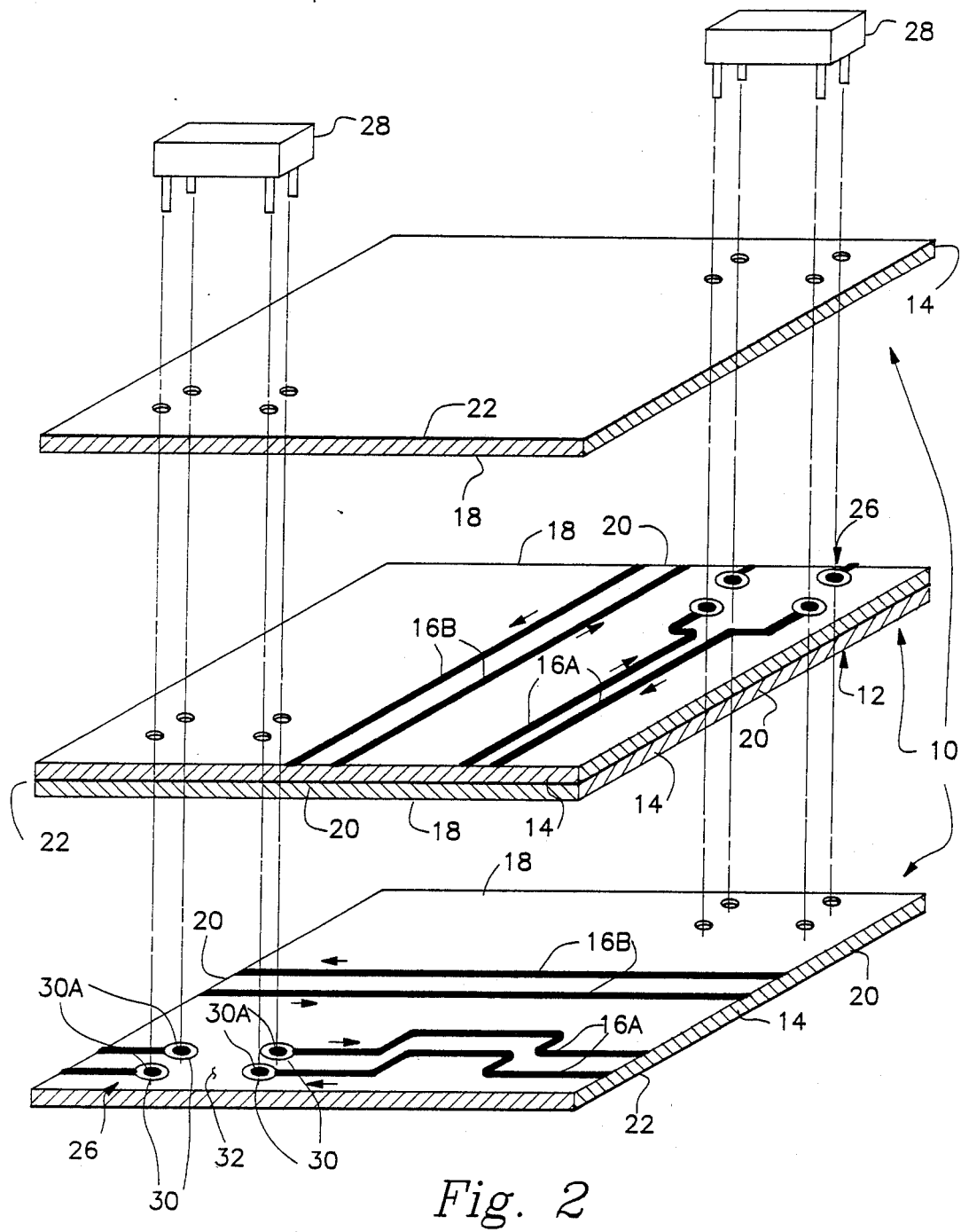
FIG. 2 is an exploded perspective view of another embodiment of the signal transmission system.

Also, the system 10 includes connector means 26 disposed in the substrates 14 for facilitating electrical connection of discrete electrical components 28 to the parallel planar transmission lines 16. Specifically, the connector means 26 preferably is in the form of spaced pairs of conductively plated through holes 30 defined in the substrates 14. As best seen in FIG. 2, the pairs of through holes 30 are placed on the parallel planar trnasmission line pair 16 such that the lines are interrupted, as at 32 in FIG. 2, along the substrates between the through hole pairs 30. As depicted in FIG. 1, the plated through holes 30 are formed differently than the plated through holes 22A. In the case of the plated through holes 30, the exposed ends or eyelets 30A of the holes 30 at the respective outer surfaces 24 of the substrates 14 are defined by and electrically isolated from the ground plane 22 by annular relief areas 34 to prevent shorting of the signals to ground.

Furthermore, as clearly depicted in an exploded form in FIG. 2, the circuitboard 12 can be composed of more than two layered substrates 14. Also, more than one pair of parallel planar transmission lines 16 can be disposed between a given pair of the substrates 14 of the circuitboard 12. Ground planes 22 are defined between adjacent pairs of substrates 14 to isolate the lines 16 between different substrate pairs from one another. Pairs of plated through holes 30 are defined in association with certain of the lines 16A for allowing connection with electrical components 28. Other of the lines 16B are for pass-through transmission only. The pass-through signal lines 16B merely pass differential-made signals from one edge 20 of the circuitboard 12 to the other, providing low loss, controlled impedance signal paths for the signals. These pass-through only signal lines carry the signals within the circuitboard, shielding them form external interferences.

Figure 3:
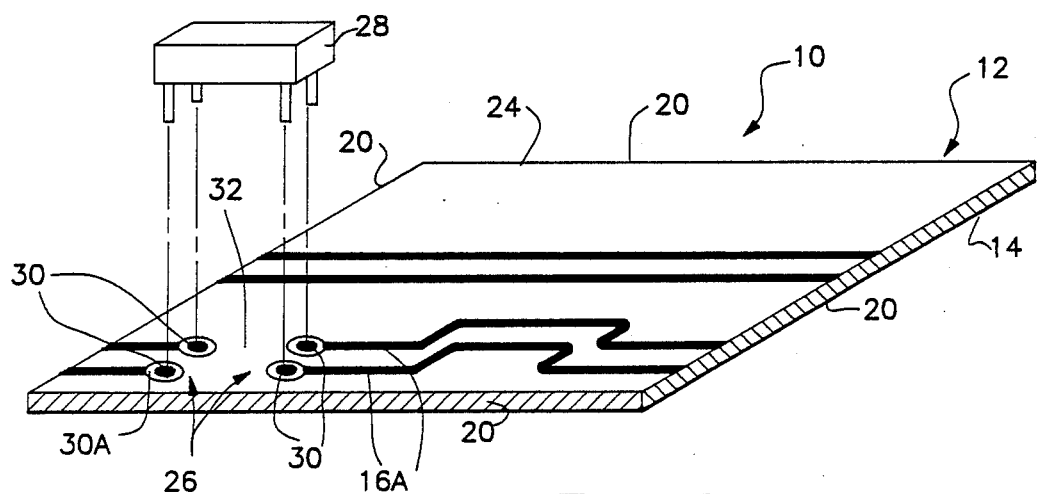
FIG. 3 is an exploded perspective view of still another embodiment of the signal transmission system.

FIG. 3 illustrates an unshielded version of the circuitboard 12 of the signal transmission system 10. The circuitboard 12 is composed of a single dielectric board substrate 14. The circuitboard 12 has one pass-through pair of the parallel planar transmission lines 16B extending uninterrupted between the pair of opposite edges 20 thereof. Also, the circuitboard 12 has another pair of parallel planar transmission lines 16A adapted by plated through holes 30 for connection with the electrical component 28.

Connection to the parallel planar transmission lines 16 in the circuitboard 12 from a twisted shielded transmission line pair (not shown) is a simple procedure. The twisted pair are connected electrically to the circuitboard via the plated through holes 30. In particular, the two twisted pair conductors are soldered to the plated through holes 30 passing through the parallel planar lines 16, whereas the twisted pair outer shield is soldered to the ground plane plated through holes 22A. No other connectors are required on the circuitboard 12 to accomplish this procedure. In addition, no connectors are required on the ends of the twisted transmission line pair.

The conventional alternative to using the pass-through parallel planar transmission lines 16A within the circuitboard 12 would be to mechanically tie down conventional twisted shielded pair transmission lines on the top surface of the circuitboard. The twisted pair then carries the signals across the top of the circuitboard from input to output. This would require the cost of connectors on both ends of the circuitboard. In addition, this conventional method of passing signals across the circuitboard results in a product that is unsightly and which may be unacceptable for use in certain military applications. By comparison, the pass-through signal lines 16B of the transmission system in one embodiment of the present invention by being within the circuitboard 12 provides a superior circuitboard product with clean lines and appearance, that will pass nearly every type of military circuitboard quality and production inspection.

The parallel planar transmission line printed circuitboards 12 offer significant cost savings in board production costs. High volume, low cost wave soldering assembly methods can be used to attach the circuit devices to these circuitboards. If circuitboard connectors are required for a specific application, they may be low cost, suitable for use with these wave soldering circuit-board fabrication methods.

Furthermore, for simplified field repair purposes, circuitboards built using these parallel planar lines can be manufactured with female socket pins wave soldered into the circuitboard plated through holes. With this approach, the devices or circuit components will plug into the circuitboard. When any device fails it can be quickly unplugged from the board and a new device plugged in and installed in the field. The circuitboard nature of the parallel planar transmission lines makes possible such simple field repair by using the female socket pins. If the components were connected with discrete controlled impedance cables, field repair would still be possible, but eventual damage to the individual cables is likely. The laminated circuitboard protects the parallel planar transmission lines from damage.

Circuit components such as packaged amplifiers, discrete semiconductors and circuit elements (resistors, capacitors and inductors), or signal switching relays can be connected to these parallel planar signal lines. FIG. 3 illustrates how differential-mode signals enter and leave the active electrical components 28 mounted on the surface of the circuitboard via the plated through holes 30. These circuit components may also be wave soldered as a low cost means of attachment to the circuitboard.

The circuitboard 12 itself provides a means of physically holding the circuit components 28, acting as a chassis. The parallel planar lines 16 built into this multi-layer circuitboard provides a means to interconnect these circuit components mounted on the circuitboard with controlled impedance, differential-mode signal lines.

Also, when a multilayer circuitboard 12 is used, a dense parts placement on the board surface is possible. This feature affords maximum use of the board surface area to hold these parts. The interconnection of these densely placed parts is a simple procedure since the parallel planar signal lines are on separate layers, isolated by the ground plates 22, as shown in FIG. 3. The parallel planar lines on separate layers allow pairs of these signal lines to cross at right angles without shorting out the line signals or interfering with the parallel planar line impedance of other line pairs from the crossover.

It is thought that the present invention and many of its attendant advantages will be understood from the foregoing description and it will be apparent that various changes may be made in the form, construction and arrangement of the parts thereof without departing from the spirit and scope of the invention or sacrificing all of its material advantages, the form hereinbefore described being merely a preferred or exemplary embodiment thereof.

Having thus described the invention, what is claimed is:

1. A signal transmission system for differential-mode signal transmission, comprising:

(a) a circuit board composed of more than a pair of dielectric board substrates having opposite surfaces and being bounded by a plurality of opposite edges, said substrates being disposed in pairs having face-to-face layered contact with one another at inner ones of said opposite surfaces thereof; and (b) at least one pair of spaced apart conductive parallel planar signal transmission lines arranged for transmission of differential-mode signals being disposed between each pair of said substrates along said inner surfaces thereof and extending between corresponding pairs of said edges of said substrates for providing pass-through transmission of differential-mode signals from one edge to another edge of said pair of substrate edges through each conductive transmission line.

2. The transmission system of claim 1 further comprising:

(c) connector means disposed in said substrates, exposed at least at one of said outer surfaces of said substrates, and electrically connected to said pair of parallel planar transmission lines for facilitating connection of electrical components thereto.

3. The transmission system of claim 2 wherein said connector means includes at least a pair of conductively plated through holes defined in said substrates.

4. The transmission system of claim 2 wherein said connector means includes at least two spaced pairs of conductively plated through holes defined in said substrates with said pair of parallel planar transmission lines being interrupted along said substrate inner surfaces between said pairs of through holes.

5. The transmission system of claim 1 further comprising:

(c) means disposed on outer ones of said surfaces of said substrates for defining ground planes thereon which electrically shield said pair of parallel planar transmission lines.

6. The transmission system of claim 5 further comprising:

(d) connector means disposed in said substrates, exposed at least at one of said outer surfaces of said substrates, electrically isolated from said ground plane defining means on said one substrate outer surface, and electrically connected to said pair of parallel planar transmission lines for facilitating connection of electrical components thereto.

7. The transmission system of claim 5 wherein said connector means includes at least a pair of conductively plated through holes defined in said substrates.

8. The transmission system of claim 5 wherein said connector means includes at least two spaced pairs of conductively plated through holes defined in said substrates with said pair of parallel planar transmission lines being interrupted along said substrate inner surfaces between said pairs of through holes.

9. The transmission system of claim 1 wherein more than one pair of said parallel planar transmission lines is disposed along said inner surfaces of said substrates and between said substrates.

* * * * *